United States Patent
Je

(10) Patent No.: US 8,901,683 B2
(45) Date of Patent: Dec. 2, 2014

(54) MICRO ELECTRO MECHANICAL SYSTEM (MEMS) MICROPHONE AND FABRICATION METHOD THEREOF

(71) Applicant: Electronics and Telecommunications Research Institute, Daejeon (KR)

(72) Inventor: Chang Han Je, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/934,661

(22) Filed: Jul. 3, 2013

(65) Prior Publication Data

US 2014/0084394 A1 Mar. 27, 2014

(30) Foreign Application Priority Data

Sep. 27, 2012 (KR) .......................... 10-2012-0107761

(51) Int. Cl.
  *H01L 29/84* (2006.01)
  *B81C 1/00* (2006.01)
  *B81B 3/00* (2006.01)

(52) U.S. Cl.
  CPC ............ *B81B 3/0018* (2013.01); *B81C 1/00158* (2013.01)
  USPC ........... 257/416; 257/415; 257/417; 257/418; 257/419; 438/53

(58) Field of Classification Search
  CPC .................................... B81B 3/00; B81C 1/00
  USPC ..................... 257/415–419; 438/53
  See application file for complete search history.

(56) References Cited

U.S. PATENT DOCUMENTS 7,023,066 B2 4/2006 Lee et al.
2014/0084396 A1* 3/2014 Jenkins et al. ................ 257/419

FOREIGN PATENT DOCUMENTS

JP 2008-034641 A 2/2008
KR 10-2008-0052222 A 6/2008
KR 10-2011-0076074 A 7/2011

OTHER PUBLICATIONS

Norizan Mohamad et al., "Effective Diaphragm Area of Spring-Supported Capacitive MEMS Microphone Designs", Smart Structures, Devices, and Systems IV, 2008, pp. 1-7, vol. 7268, SPIE.
Quanbo Zou et al., "Design and Fabrication of Silicon Condenser Microphone Using Corrugated Diaphragm Technique", Journal of Microelectromechanical Systems, Sep. 1996, pp. 197-204, vol. 5, No. 3, IEEE.

* cited by examiner

*Primary Examiner* — Jami M Valentine

(57) ABSTRACT

Provided is a structure for improving performance of a micro electro mechanical system (MEMS) microphone by preventing deformation from occurring due to a residual stress and a package stress of a membrane and by decreasing membrane rigidity. A MEMS microphone according to the present disclosure includes a backplate formed on a substrate; an insulating layer formed on the substrate to surround the backplate; a membrane formed to be separate from above the backplate by a predetermined interval; a membrane supporting portion configured to connect the membrane to the substrate; and a buffering portion formed in a double spring structure between the membrane and the membrane supporting portion.

11 Claims, 5 Drawing Sheets

MICRO ELECTRO MECHANICAL SYSTEM (MEMS) MICROPHONE AND FABRICATION METHOD THEREOF

CROSS-REFERENCE TO RELATED APPLICATIONS

This application is based on and claims priority from Korean Patent Application No. 10-2012-0107761, filed on Sep. 27, 2012, with the Korean Intellectual Property Office, the disclosure of which is incorporated herein in its entirety by reference.

TECHNICAL FIELD

The present disclosure relates to a micro electro mechanical system (MEMS) microphone and a fabrication method thereof, and more particularly, to a structure for improving performance of a MEMS microphone by preventing deformation from occurring due to a residual stress and a package stress of a membrane and by decreasing membrane rigidity.

BACKGROUND

An acoustic sensor is a device to convert voice to an electrical signal and types of micro electro mechanical system (MEMS) acoustic sensors include a capacitive type and a piezoelectric type. A capacitive MEMS acoustic sensor is based on a principle of a condenser that enables two electrodes to face each other. Here, one electrode is fixed on a substrate and the other electrode is afloat in the air whereby the capacitive MEMS acoustic sensor moves in reaction to external sound pressure using a diaphragm. When the external sound pressure is received, the diaphragm vibrates and a capacitance value varies according to a change in a gap between two electrodes. Accordingly, current flows. The capacitive type has advantages in that it is stable and a frequency characteristic is excellent. Therefore, most conventional acoustic sensors use the capacitive scheme.

FIG. 1 is a perspective view illustrating a structure of a capacitive MEMS microphone having a flexible spring according to the related art, and FIG. 2 is a perspective view illustrating a structure of a capacitive MEMS microphone having a spring and a stop bump according to the related art.

Referring to FIG. 1, in the case of the conventional capacitive MEMS microphone, rigidity is intended to be decreased by inserting a flexible spring 15 in a portion in which a membrane 14 is connected to a substrate 11, in order to decrease rigidity of the membrane 14 and increase sensitivity of a microphone. However, in this case, deformation occurs in the flexible spring 15 due to a process stress and a package stress. Accordingly, the membrane 14 also becomes to move whereby a sensing gap 13 may vary or the membrane 14 may abnormally operate.

In FIG. 2, to decrease an effect of such deformation, proposed is a method of maintaining the sensing gap 13 between the membrane 14 and a backplate 16 to be constant while operating by inserting a structure 17 for maintaining an interval into the substrate 11 or the membrane 14. In this case, even though it is possible to maintain the sensing gap 13 between the membrane 14 and the backplate 16 to be constant while operating, it is difficult to decrease rigidity of the membrane 14 and not possible to decrease the effect from a package stress.

Accordingly, there is a need for a method that may achieve high sensitivity by decreasing rigidity of a membrane in a capacitive MEMS microphone and by decreasing the effect from a process stress and a package stress.

SUMMARY

The present disclosure has been made in an effort to provide a micro electro mechanical system (MEMS) microphone that may decrease a residual stress of a membrane using a double spring and spacer structure, decrease rigidity, and prevent deformation of the membrane from occurring due to a package stress, and a fabrication method thereof.

An exemplary embodiment of the present disclosure provides a MEMS microphone, including a backplate formed on a substrate; an insulating layer formed on the substrate to surround the backplate, a membrane formed to be separate from above the backplate by a predetermined interval; a membrane supporting portion configured to connect the membrane to the substrate; and a buffering portion formed in a double spring structure between the membrane and the membrane supporting portion.

Another exemplary embodiment of the present disclosure provides a MEMS microphone, including a substrate having a first insulating layer; a membrane formed on the substrate; a membrane supporting portion configured to fix the membrane to the substrate; a buffering portion formed in a double spring structure between the membrane and the membrane supporting portion; and a backplate formed to be separate from above the membrane by a predetermined interval.

Still another exemplary embodiment of the present disclosure provides a method of fabricating a MEMS microphone, the method including forming a backplate having a sound hole on a substrate; forming an insulating layer as an outer edge of the backplate on the substrate; depositing a sacrificial layer on the substrate on which the insulating layer is formed; forming a membrane having a buffering portion in a double spring structure and a membrane supporting portion on the sacrificial layer, forming an acoustic chamber by etching a portion of the substrate; and removing the sacrificial layer through the acoustic chamber and the sound hole.

Yet another exemplary embodiment of the present disclosure provides a method of fabricating a MEMS microphone, the method including forming a first insulating layer on a substrate; forming a membrane having a buffering portion in a double spring structure and a membrane supporting portion on the substrate on which the first insulating layer is formed; depositing a sacrificial layer on the membrane and the membrane supporting portion: forming a groove for forming a second insulating layer by etching a portion of the sacrificial layer; forming the second insulating layer on the sacrificial layer on which the groove is formed; forming a backplate on which at least one sound hole is formed, on the sacrificial layer on which the second insulating layer is formed; and etching and thereby removing the sacrificial layer.

According to the exemplary embodiments of the present disclosure, it is possible to decrease a residual stress of a membrane according to a process by providing a buffering portion in a double spring structure to a MEMS microphone, and to increase sensitivity of the membrane about sound pressure by preventing deformation from occurring due to a package stress and decreasing rigidity of the membrane. Accordingly, it is possible to improve performance of the MEMS microphone.

According to the exemplary embodiments of the present disclosure, it is possible to decrease a process stress and to maintain a sensing gap to be constant by using a gap maintaining structure.

According to the exemplary embodiments of the present disclosure, an inner spring has rigidity greater than an outer spring and thus, pull-in does not occur in a sensing gap and bias voltage when a MEMS microphone operates.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
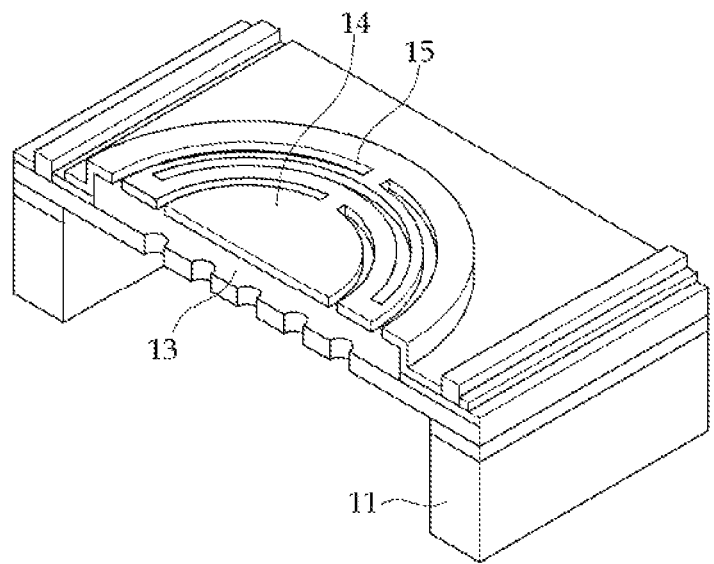
FIG. 1 is a perspective view illustrating a structure of a capacitive micro electro mechanical system (MEMS) microphone having a flexible spring according to the related art.
Figure 2:
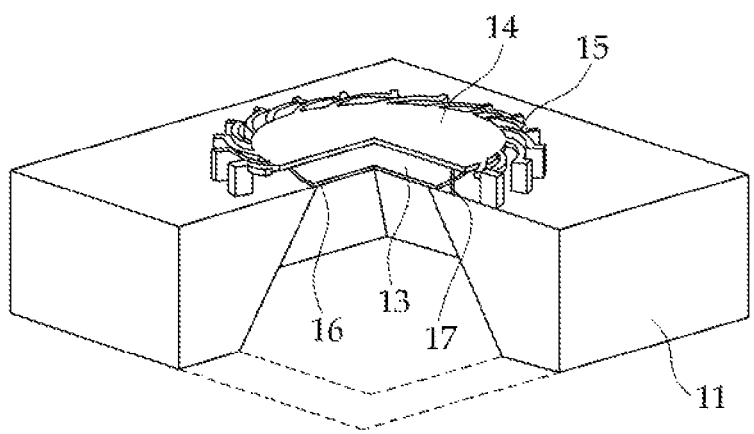
FIG. 2 is a perspective view illustrating a structure of a capacitive MEMS structure having a spring and a stop bump according to the related art.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. A configuration of the present disclosure and an operation effect according thereto will be understood clearly from the following detailed description. Prior to describing the detailed description of the present disclosure, it should be noted that like reference numerals refer to like constituent elements even though they are illustrated in different drawings, and that when it is determined detailed description related to a known function or configuration they may render the purpose of the present disclosure unnecessarily ambiguous, the detailed description will be omitted here.

Figure 3:
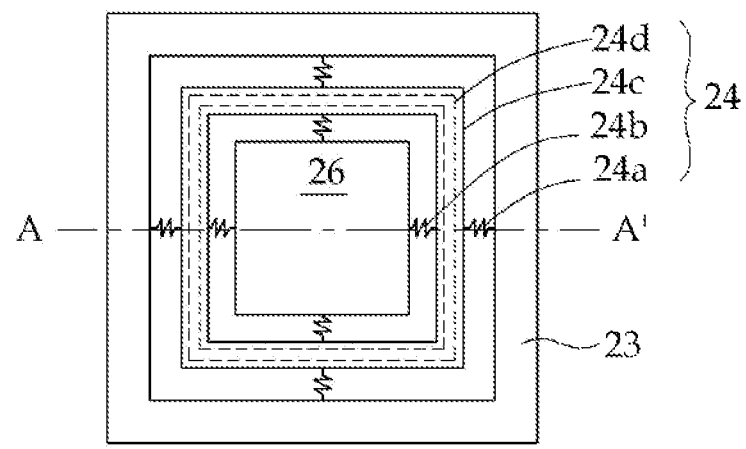
FIG. 3 is a top view of a MEMS microphone according to an exemplary embodiment of the present disclosure.
Figure 4:
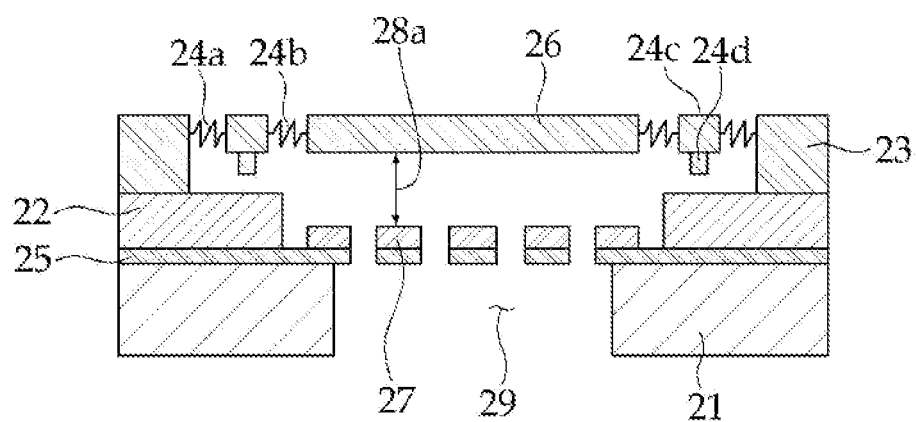
FIG. 4 is a cross-sectional view taken along line A-A' of FIG. 3.

FIG. 3 is a top view of a micro electro mechanical system (MEMS) microphone according to an exemplary embodiment of the present disclosure, and FIG. 4 is a cross-sectional view cut along line A-A' of FIG. 3

As illustrated in FIGS. 3 and 4, in the MEMS microphone according to an exemplary embodiment of the present disclosure, a first insulating layer 25 and a backplate 27 are formed on a substrate 21, and a second insulating layer 22 is formed to surround the back-plate 27.

A membrane 26 is formed to be separate from above the backplate 27 by a predetermined interval 28a, and a membrane supporting portion 23 is formed to connect the membrane 26 to the substrate 21.

A buffering portion 24 in a double spring structure is formed between the membrane 26 and the membrane supporting portion 23.

The buffering portion 24 functions to prevent deformation from occurring due to an external stress according to packaging.

The buffering portion 24 includes an inner spring 24b, an outer spring 24a, a spacer 24c, and a spacer protruding portion 24d.

More specifically, the inner spring 24b is connected between the membrane 26 and the spacer 24c, and the outer spring 24a is connected between the spacer 24c and the membrane supporting portion 23. The inner spring 24b has rigidity smaller than the membrane 26 and thus, functions to decrease a process stress of the membrane 26 and to decrease rigidity of the membrane 26. The outer spring 24a functions to perform buffering so that a stress of the substrate 21, occurring due to a bonding material and a bonding process while packaging a device, is not transferred to the membrane 26.

The spacer 24c has the spacer protruding portion 24d. The spacer protruding portion 24d is formed to be separate from above the second insulating layer 22 by a predetermined interval 28b. When the MEMS microphone operates, the spacer protruding portion 24d contacts with the second insulating layer 22. The spacer 24c may prevent deformation of the membrane 26 that may occur due to deformation of the double springs 24a and 24b, and may maintain a sensing gap 28c by maintaining an interval between the membrane 26 and the backplate 27 to be constant while operating, thereby improving reliability.

Figure 5:
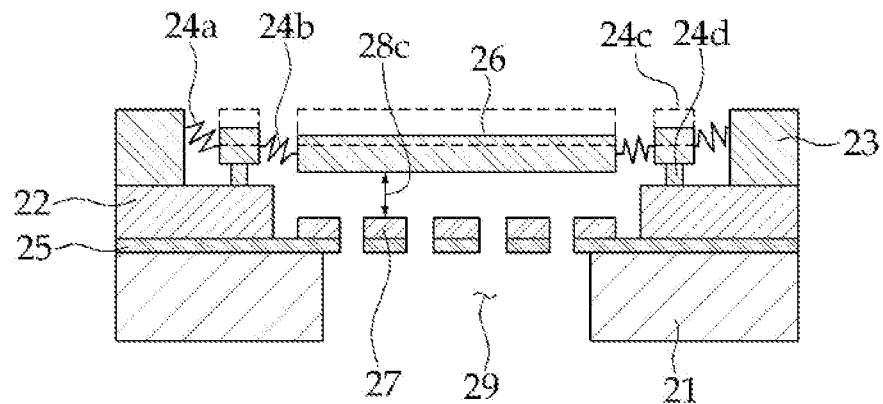
FIG. 5 is a cross-sectional view illustrating an exemplary embodiment of a method of operating a MEMS microphone according to the present disclosure.

FIG. 5 is a cross-sectional view illustrating an exemplary embodiment of a method of operating a MEMS microphone according to the present disclosure FIG. 5 illustrates a state before a fabricated MEMS microphone operates. Before operation, the membrane 26 becomes to be separate from above the substrate 21 by the predetermined interval 28a by the double springs 24a and 24b and the spacer 24c.

FIG. 5 illustrates a state in which the MEMS microphone according to an exemplary embodiment of the present disclosures operates.

As illustrated in FIG. 5, to sense a change in capacitance, bias voltage having a predetermined value is applied between the membrane 26 and the backplate 27 and an electrostatic force occurs due to the bias voltage. Accordingly, the membrane 26 moves toward the backplate 27. In FIG. 5, the membrane 26 indicated by a dotted line indicates a state before the bias voltage is applied and the membrane 26 indicated by a solid line indicates a state after the bias voltage is applied.

In this instance, when the applied bias voltage is greater than pull-in voltage of the outer spring 24a, pull-in occurs in the outer spring 24a and the spacer protruding portion 24c moves until the spacer protruding portion 24c contacts with the second insulating layer 22. Here, even though the interval 28a between the membrane 26 and the backplate 27 varies due to a process stress and a package stress, the sensing gap 28c is maintained regardless of the varying interval 28a. The inner spring 24b may have rigidity greater than the outer spring 24a to prevent pull-in from occurring in the sensing gap 28c and the bias voltage while operating.

FIGS. 6 through 12 are cross-sectional views to sequentially describe a method of fabricating a MEMS microphone according to the present disclosure.

Figure 6:
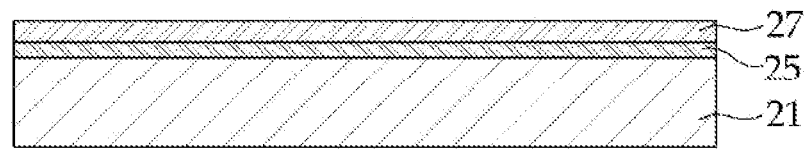
FIGS. 6 through 12 are cross-sectional views to sequentially describe a method of fabricating a MEMS microphone according to the present disclosure.
Figure 7:
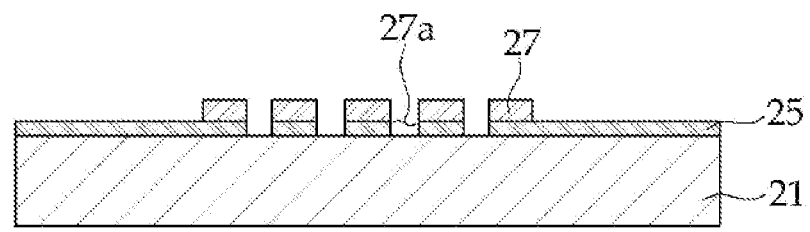

Initially, as illustrated in FIGS. 6 and 7, a material of the first insulating layer 25 and an electrode material of the backplate 27 are deposited on the silicone substrate 21, and a sound pressure input hole 27a is formed in the backplate 27 through etching. The sound pressure input hole 27a functions to receive sound pressure through an acoustic chamber 29 of FIG. 11 that is provided later, and is used as an etching path for removing a sacrificial layer 31 of FIG. 10. The first insulating layer 25 is to insulate the backplate 27 from the substrate 21 and thus, may be omitted depending on cases.

Figure 8:
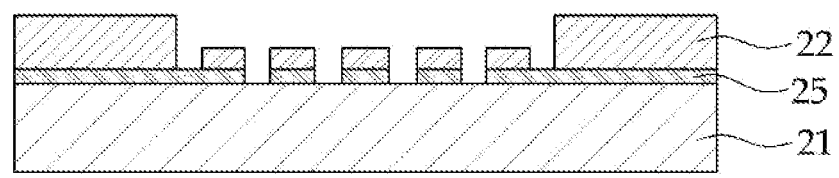

Next, as illustrated in FIG. 8, the second insulating layer 22 to contact with the spacer 24c is formed by depositing and patterning an insulating material on the substrate 21 on which the backplate 27 is formed. The second insulating layer 22 is deposited on an outer edge of an area in which the backplate 27 is formed.

Figure 9:
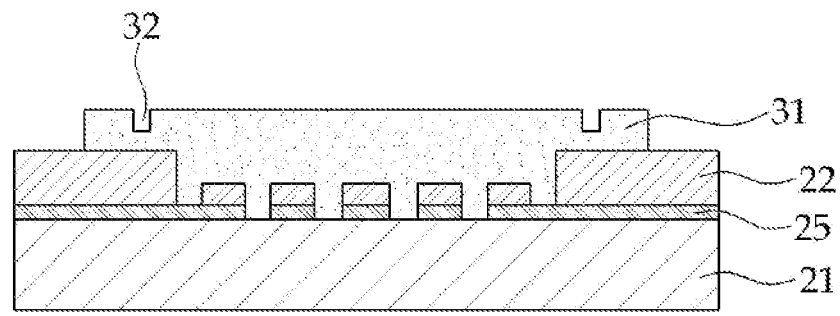

As illustrated in FIG. 9, when the second insulating layer 22 is formed the sacrificial layer 31 is formed on a portion of the second insulating layer 22 and the backplate 27. The sacrificial layer 31 is to enable the membrane 26 of FIG. 10 formed during a following process to be afloat. The sacrificial layer 31 may be formed as, for example, an oxide film or an organic film. The sacrificial layer 31 is formed using a material having etching selectivity different from a second insulating layer 22 and a first insulating layer 25. The sacrificial layer 31 may be formed to have a thickness of a few μm. Next, a groove 32 is formed at a position at which the spacer protruding portion 24d is to be formed by patterning the sacrificial layer 31. The groove 32 functions as a mould of the spacer protruding portion 24d.

Figure 10:
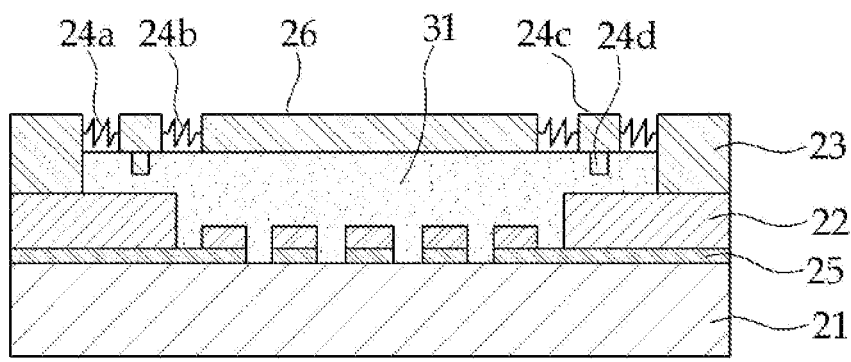

Next, as illustrated in FIG. 10, the buffering portion 24 having the double springs 24a and 24b, the spacer 24c, and the spacer protruding portion 24d, and the membrane supporting portion 23 are formed by depositing and patterning a material of the membrane 26 on the sacrificial layer 31.

The membrane 26, the spacer 24c, the spacer protruding portion 24d, and the membrane supporting portion 23 are formed through patterning by using a photolithography process on the sacrificial layer 31 and the exposed second insulating layer 22. Next, the inner spring 24b is formed between the membrane 26 and the spacer 24c, and the outer spring 24a is formed between the spacer 24c and the membrane supporting portion 23a. Here, the outer spring 24a may have rigidity smaller than the inner spring 24b. As described above, the double spring structure of the buffering portion 24 and the spacer 24c function to perform buffering so that the stress of the substrate 21, occurring while packaging a device, may not be transferred to the membrane 26.

When the MEMS microphone operates the space protruding portion 24d contacts with the second insulating layer 22. The spacer 24c may prevent deformation of the membrane 26 that may occur due to deformation of the double springs 24a and 24b and may maintain the sensing gap 28c between the membrane 26 and the backplate 27 to be a minimum distance, thereby improving reliability.

Figure 11:
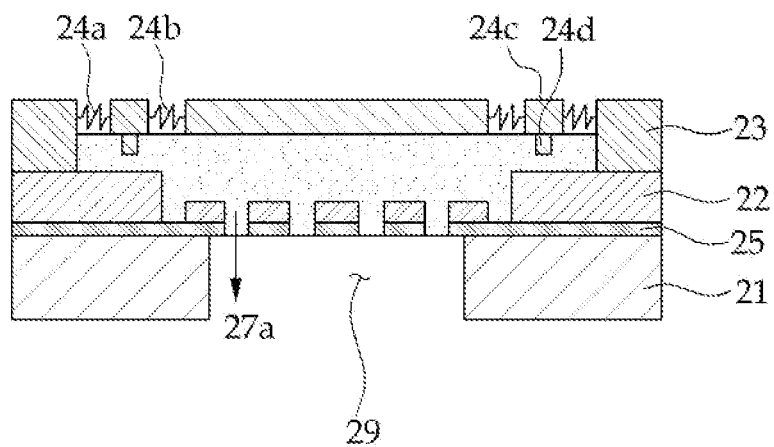

As illustrated in FIG. 11, the acoustic chamber 29 is formed at the rear by selectively etching the substrate 21. The acoustic chamber 29 is formed by etching a portion of the substrate 21 so that the first insulating layer 25 and the sound pressure input hole 27a may be exposed.

The acoustic chamber 29 may be formed by etching the substrate 21 using a dry etching method. An etching process may be performed using a dry etching process when the substrate 21 is a Si substrate. For example, the dry etching process may be performed using XeF2 gas that enables anisotropic etching. That is, the dry etching process may be performed by injecting appropriate etching gas into a forming material of the substrate 21.

Figure 12:
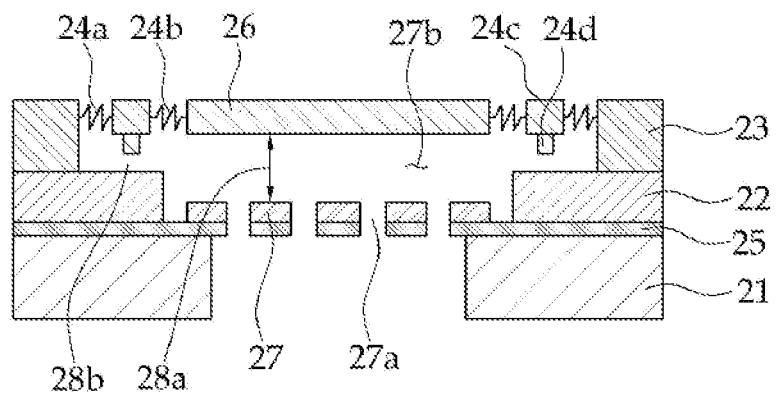

After forming the acoustic chamber 29 at the rear, a gap 27b is formed between the membrane 26 and the backplate 27 by removing the sacrificial layer 31 as illustrated in FIG. 12.

Through this, it is possible to fabricate the MEMS microphone having the buffering portion 24 that includes the double springs 24a and 24b, the spacer 24c, and the spacer protruding portion 24d.

A structure in which a membrane is positioned below a backplate will be also described as another exemplary embodiment of the present disclosure with reference to FIG. 13.

Figure 13:
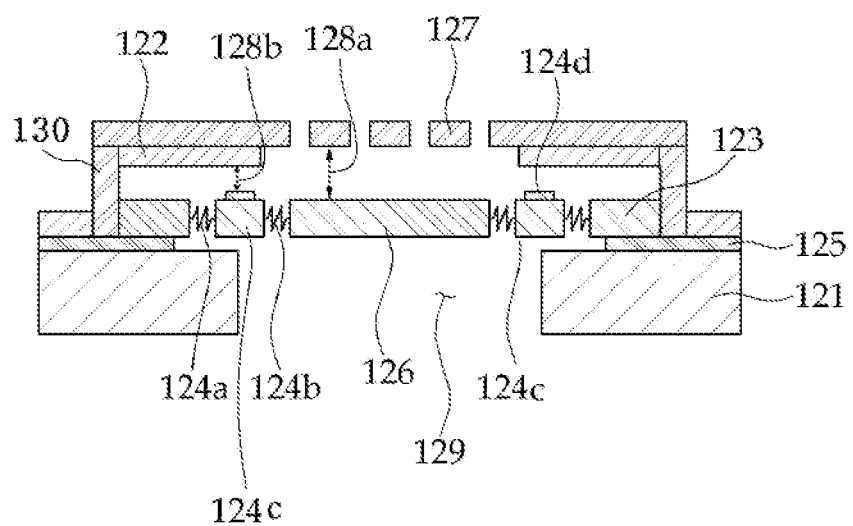
FIG. 13 is a top view of a MEMS microphone according to another exemplary embodiment of the present disclosure.

FIG. 13 illustrates an exemplary embodiment of a MEMS microphone having double springs 124a and 124b, and a spacer 124c in a case in which a membrane 126 is positioned below a backplate 127. Similarly, the membrane 126 is connected to a substrate 121 through the double springs 124a and 124b, and the spacer 124c, and the backplate 127 is formed to be separate from above the membrane 127 using a sacrificial layer. A second insulating layer 122 is formed to face a protruding portion of the spacer 124c below the backplate 127.

In a structure in which the membrane 126 is positioned below the backplate 127, the substrate 121 has a first insulating layer 125, and the membrane 126 is formed on the substrate 121. The membrane 126 is fixed on the substrate 121 by a membrane supporting portion 123. The backplate 127 is formed to be separate from above the membrane 126 by a predetermined interval 128a. The second insulating layer 122 is formed on a lower outer edge portion of the backplate 127.

A buffering portion 124 (124a, 124b, 12c, 124d) in a double spring structure is formed between the membrane 126 and the membrane supporting portion 123. The buffering portion 124 includes an inner spring 124b, an outer spring 124a, the spacer 124c, and a spacer protruding portion 124d.

The inner spring 124b is connected between the membrane 126 and the spacer 124c, and the outer spring 124a is connected between the spacer 124c and the membrane supporting portion 123. The outer spring 124a may have rigidity smaller than the inner spring 124b.

The spacer protruding portion 124d is formed on the top surface of the spacer 124c, and is formed to face the second insulating layer 122 attached to the backplate 127.

Hereinafter, a method of fabricating a MEMS microphone in a structure in which the membrane 126 formed in FIG. 3 is positioned below the backplate 127 will be described. Here, a description relating to the same method as the first exemplary embodiment will be omitted.

The first insulating layer 125 is formed on the substrate 121.

The membrane 126 having the buffering portion 124 in a double spring structure and the membrane supporting portion 123 are formed on the substrate 121 on which the first insulating layer 125 is formed. Here, the membrane 126, the inner spring 124b, the spacer 124c, the outer spring 124a, and the membrane supporting portion 123 are formed to be positioned sequentially from a center toward an outer edge. Next, the spacer protruding portion 124d is formed on the spacer 124c.

Next, the sacrificial layer is deposited on the membrane 126 and the membrane supporting portion 123. A backplate supporter 130 is formed on an outer edge of the sacrificial layer.

A groove for forming the second insulating layer 122 is formed by etching a portion of the deposited sacrificial layer, and the second insulating layer 122 is formed on the sacrificial layer on which the groove is formed.

The backplate 127 in which at least one sound hole is formed is formed on the sacrificial layer on which the second insulating layer 122 is formed, and the sacrificial layer is etched and thereby removed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A micro electro mechanical system (MEMS) microphone, comprising:
   a backplate formed on a substrate;
   an insulating layer formed on the substrate to surround the backplate;
   a membrane formed to be separate from above the backplate by a predetermined interval;
   a membrane supporting portion configured to connect the membrane to the substrate; and
   a buffering portion formed in a double spring structure between the membrane and the membrane supporting portion.

2. The MEMS microphone of claim 1, wherein the buffering portion comprises:
   an inner spring connected to the membrane;
   an outer spring connected to the membrane supporting portion; and
   a spacer connected between the inner spring and the outer spring.

3. The MEMS microphone of claim 2, further comprising:
   a protruding portion formed on the bottom surface of the spacer.

4. The MEMS microphone of claim 2, wherein the outer spring has rigidity smaller than the inner spring.

5. The MEMS microphone of claim 3, wherein an addition of a height of the protruding portion and a height of the insulating portion is a distance maintaining gap.

6. A MEMS microphone, comprising:
   a substrate having a first insulating layer;
   a membrane formed on the substrate;
   a membrane supporting portion configured to fix the membrane to the substrate;
   a buffering portion formed in a double spring structure between the membrane and the membrane supporting portion; and
   a backplate formed to be separate from above the membrane by a predetermined interval.

7. The MEMS microphone of claim 6, wherein the buffering portion comprises:
   an inner spring connected to the membrane;
   an outer spring connected to the membrane supporting portion; and
   a spacer connected between the inner spring and the outer spring.

8. The MEMS microphone of claim 7, further comprising:
   a second insulating layer attached on the bottom surface of the backplate; and
   a protruding portion formed on the top surface of the spacer to face the second insulating layer.

9. The MEMS microphone of claim 7, wherein the outer spring has rigidity smaller than the inner spring.

10. The MEMS microphone of claim 8, wherein an addition of a height of the protruding portion and a height of the second insulating portion is a distance maintaining gap.

11. The MEMS microphone of claim 6, further comprising:
    a backplate supporting portion configured to fix the backplate to the substrate.

* * * * *